United States Patent [19]

Suzuki et al.

[11] Patent Number: 4,481,427

[45] Date of Patent: Nov. 6, 1984

[54] TTL CIRCUIT HAVING DELAY MEANS FOR DELAYING THE OPERATION UNTIL THE SUPPLY VOLTAGE REACHES A CERTAIN THRESHOLD

[75] Inventors: Hirokazu Suzuki, Yamato; Takehiro Akiyama, Yokohama, both of Japan

[73] Assignee: Fujitsu Limited, Kawasaki, Japan

[21] Appl. No.: 445,039

[22] Filed: Nov. 29, 1982

[30] Foreign Application Priority Data

Nov. 30, 1981 [JP] Japan ................................ 56-192443

[51] Int. Cl.³ .................. H03K 19/003; H03K 17/22; H03K 19/088
[52] U.S. Cl. .............................. 307/200 A; 307/456; 307/565; 307/597
[58] Field of Search ............... 307/443, 445, 446, 456, 307/457, 458, 475, 270, 466, 200 A, 360, 361, 559, 592, 297, 544, 549, 473, 551, 565, 597; 340/786, 803

[56] References Cited

U.S. PATENT DOCUMENTS

| | | | |
|---|---|---|---|
| 3,979,611 | 9/1976 | Payne et al. | 307/565 X |
| 4,131,808 | 12/1978 | Kuo | 307/443 X |
| 4,254,347 | 3/1981 | Ray | 307/592 |
| 4,368,395 | 1/1983 | Taylor | 307/475 X |
| 4,385,243 | 5/1983 | Suzuki | 307/597 X |
| 4,446,499 | 5/1984 | Kishimoto et al. | 307/200 A X |

FOREIGN PATENT DOCUMENTS 80874  6/1983  European Pat. Off. ........ 307/200 A

Primary Examiner—Stanley D. Miller
Assistant Examiner—David R. Bertelson
Attorney, Agent, or Firm—Staas & Halsey

[57] ABSTRACT

A TTL circuit including an input circuit, an output circuit, elements for controlling the output circuit, and elements for delaying the operation of the controlling elements immediately after the voltage supply is turned on. The output of the TTL circuit is maintained at on "H" level until the voltage supply rises up to a predetermined level.

5 Claims, 3 Drawing Figures

TTL CIRCUIT HAVING DELAY MEANS FOR DELAYING THE OPERATION UNTIL THE SUPPLY VOLTAGE REACHES A CERTAIN THRESHOLD

BACKGROUND OF THE INVENTION

This invention relates to a TTL (Transistor Transistor Logic) circuit in which the output level is maintained at the "H" level immediately after the power supply is turned on.

In a facsimile machine of a thermosensitive printer type, the enable period of the thermal heads of the printer is usually controlled by the output of a gate circuit called a "set gate", etc. A driving circuit for the thermal heads is illustrated in FIG. 1. In FIG. 1, SG indicates a set gate circuit, INV indicates an inverter circuit, DA1 through DAm indicate data latch circuits, OG1 through OGm indicate output gate circuits with NAND logic, TH1 through THm indicate thermal heads, and RL1 through RLm indicate resistors for current limiting. The set gate circuit SG is a TTL logic circuit which receives an external set input SET indicating whether the operation can be effected, and generates an output signal having the same logic level as the set signal. The inverter circuit INV inverts the output of the set gate circuit SG, and the output of the inverter is supplied to all of the output gate circuits OG1 through OGm.

When the set input SET is "H", the output of the inverter circuit INV is "L", all of the outputs of the output gate circuits OG1 through OGm are "H" and no current flows through any of the thermal heads TH1 through THm. On the other hand, when the set input SET is "L", the output of the inverter circuit INV is "H" and, when the output of the corresponding data latch circuit is "L", the output of each of the output gate circuits OG1 through OGm is "H". When the output of the corresponding data latch circuit is "H", the output of each of the output gate circuits OG1 through OGm is "L". When the output of an output gate circuit OGi is "L", current flows through a thermal head THi and a character corresponding to the output data of the latch circuit is printed.

In the driver circuit of FIG. 1, there may be the following problem immediately after the power supply is turned on. The set input SET should be kept at "H" until the printed data is input into the latch circuits DA1 through DAm and the printing operation is instructed. However, in a transition condition, such as when turning on the power supply, the set input SET does not settle into either a "H" or "L" state. Thus, it is not certain if the output of the set gate circuit SG will become "H" or "L" i.e., it may become "H" or "L" randomly. If the output of the set gate SG becomes "L", then the output of the inverter circuit INV becomes "H". In this condition, if any one of the data outputs of the latch circuits DA1 through DAm is "H", then the output of the corresponding output gate circuit becomes "L" and a current flows through the corresponding thermal head. Since the current flowing through the terminal head is considerably large, even several milliseconds of current may result in printing. Thus, undesirable stain-like printing may take place on the paper in the transition period when turning on the power supply.

SUMMARY OF THE INVENTION

An object of the present invention is to provide a TTL circuit whose output is maintained at the "H" level immediately after the power supply is turned on. The TTL circuit can be used as the above-mentioned set gate circuit and can prevent the paper from being stained during the transition period.

In accordance with the present invention, there is provided a TTL circuit including an input circuit and an output circuit there is also provided means for controlling the output circuit and means for delaying the operation of the controlling means until the voltage supply rises up to a predetermined level after the voltage supply is turned on, whereby the output of the TTL circuit is forced to be "H" level until the voltage supply rises up to the predetermined level.

BRIEF DESCRIPTION OF THE DRAWINGS

FIG. 3 is a waveform diagram of the voltage waveforms in the TTL circuit of FIG. 2 at the time the voltage supply is turned on.

DETAILED DESCRIPTION OF THE PREFERRED EMBODIMENT

A TTL circuit according to the present invention will be described in detail reference to the accompanying drawings.

Figure 1:
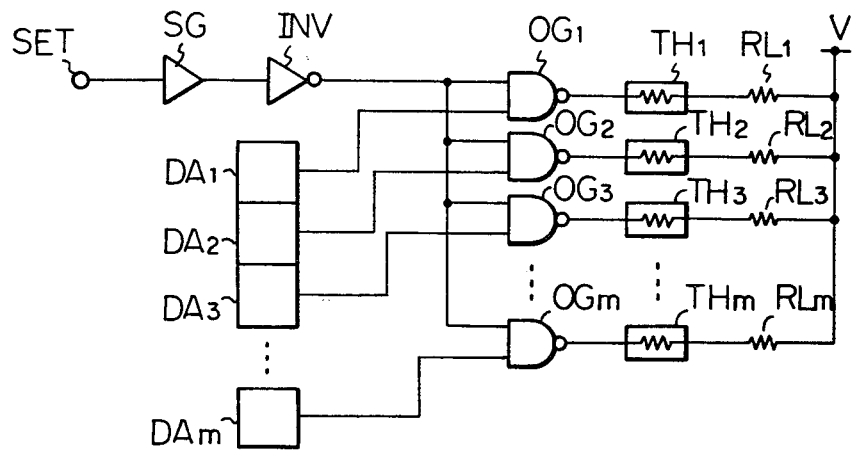
FIG. 1 is a block circuit diagram of a driver circuit of a thermal head.
Figure 2:
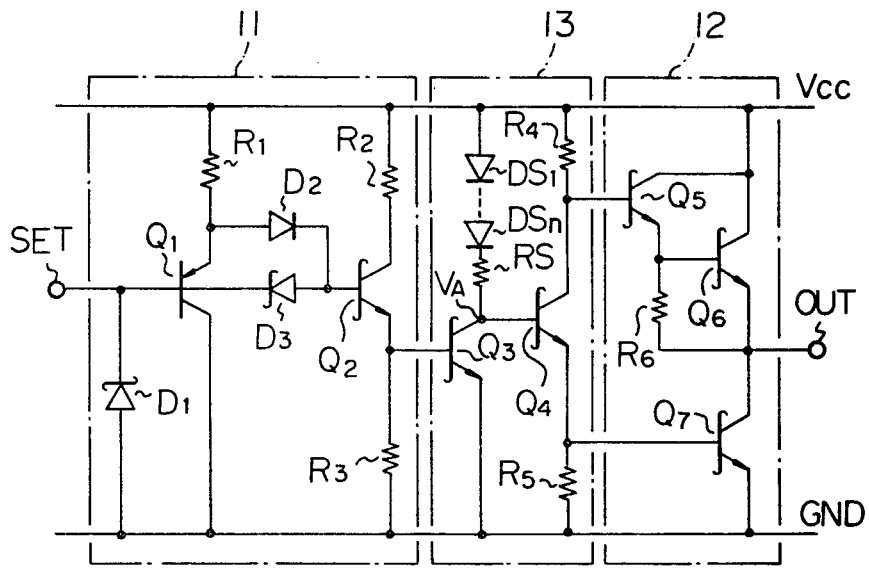
FIG. 2 is a circuit diagram of a TTL circuit in accordance with one embodiment of the present invention.

FIG. 2 is a circuit diagram of a TTL circuit in accordance with one embodiment of the present inveniton. The TTL circuit of FIG. 2 can be used a the set gate circuit SG of FIG. 1. The TTL circuit of FIG. 2 comprises an input circuit 11, an output circuit 12, and a control circuit 13. The input circuit 11 has transistors Q1 and Q2, diodes D1, D2, and D3, and resistors R1, R2, and R3. The output circuit 12 has transistors Q5, Q6 and Q7 and a resistor R6. The control circuit 13 has transistors Q3 and Q4, diodes DS1 through DSn, and resistors RS, R4, and R5.

The set input SET is supplied to the base of the transistor Q1. When the set input SET is "L", the current flowing from the voltage supply Vcc through the resistor R1 flows from the emitter of the npn transistor Q1 to its base and the base potential of the transistor Q2 becomes low. Therefore, the transistors Q2 and Q3 become off. Accordingly, the current flowing from the voltage supply Vcc through the diodes DS1, ..., DSn and resistor RS flows into the base of the transistor Q4, which is usually called a phase splitter transistor. Thus, the transistor Q4 turns on, and the output transistor Q7, whose base is connected to the emitter of the transistor Q4 and whose emitter is connected to the ground, turns on. On the other hand, the transistors Q5, whose base is connected to the collector of the transistor Q4, and Q6, having a Darlington type connection, are turned off. Thus, the output OUT becomes "L".

When the set input SET is "H", the transistor Q1 becomes off and the current flowing from the voltage supply Vcc through the resistor R1 flows through the diode D2 into the base of the transistor Q2. Thus, the transistor Q2 turns on and the transistor Q3 turns on. Therefore, the base potential of the transistor Q4 becomes low. Accordingly, the transistor Q4 turns off, and the output transistor Q7 turns off. On the other hand, the Darlington connection transistors Q5 and Q6 turn on, and the output OUT becomes "H".

In the above-mentioned operation of the TTL circuit of FIG. 2, in order to turn on the output transistor Q7, it is necessary for the base potential of the transistor Q4 to be increased by at least twice the base-emitter voltage $V_{BE}$, i.e., $2 V_{BE}$. In the prior art TTL circuit, the base of the transistor Q4 is connected to the voltage supply Vcc only through the resistor RS. Accordingly, the transistor Q4 may be turned on after the voltage supply Vcc turns on and rises up to $Vcc > 2 V_{BE}$. Thus, in the prior art TTL circuit, as described before, the output OUT may be "L" transiently after the voltage supply turns on.

Figure 3:
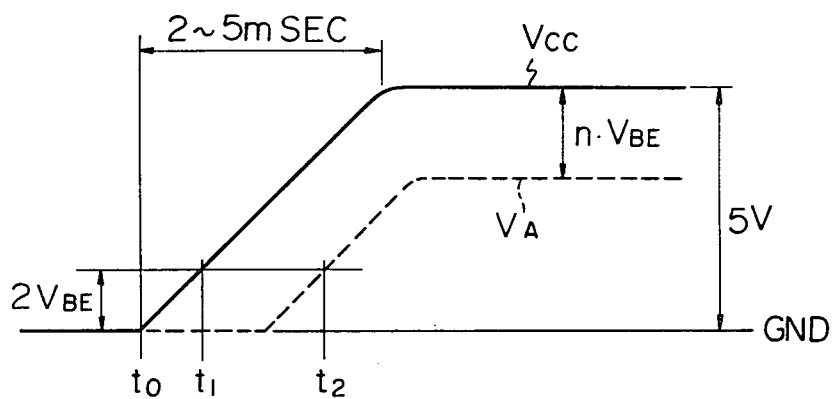

In the TTL circuit of FIG. 2, the base of the transistor Q4 is connected to the voltage supply Vcc through the diodes DS1 through DSn and the resistor RS, so that the base potential of the transistor Q4 cannot rise above $2 V_{BE}$ until the voltage supply Vcc rises up to a sufficiently high level after turning on. The waveform of the voltage supply Vcc at the turning-on time is illustrated in FIG. 3 by the continuous line. As seen from FIG. 3, the voltage supply Vcc is turned on at the time $t_0$ and rises up to 5 V in 2 to 5 milliseconds. The broken line of FIG. 3 illustrates the upper limit of the base potential $V_A$ of the transistor Q4. The voltage supply Vcc becomes $2 V_{BE}$ at the time $t_1$, and the upper limit of the voltage $V_A$ becomes $2 V_{BE}$ at the time $t_2$. The final upper limit of the voltage $V_A$ is lower than the voltage supply Vcc by $n \cdot V_{BE}$ (n being the number of the diodes DS1 through DSn, and $V_{BE}$ being the forward bias voltage of each diode).

During the period from $t_0$ to $t_1$, all the output transistors Q5, Q6, and Q7 are off, and the output OUT is in a high impedance state. During the period from $t_1$ to $t_2$, the base voltage of the transistor Q4 is lower than $2 V_{BE}$. Therefore, the output transistor Q7 is off without regard to the set input SET and the output OUT is forced to be "H". The set input SET, which is produced by an external TTL circuit, can settle to "H" from a time $t_x$ after the time $t_1$. Accordingly, by selecting the time $t_2$ to be after $t_x$, the output OUT is kept at "H" from the time of turning on to the time the set input SET is changed to "L". Thus, even if the set input SET may become "L" unexpectedly in the transition time from $t_0$ to $t_x$, this "L" level does not appear in the output OUT.

The number n of the diodes DS1 through DSn can be determined by the following equation;

$$Vcc - n \cdot V_{BE} > 2 V_{BE}$$

Assuming $V_{BE} = 0.8$ V, $Vcc = 5$ V, then $n \leq 4$. In the case of n=4, the output OUT is forced to be "L" until the voltage supply Vcc rises up to 4.8 V. In the case of n=3, the output OUT is forced to be "H" until the voltage supply Vcc rises up to 4.0 V.

If the TTL circuit of FIG. 2 is used as the set gate circuit SG of FIG. 1, the outputs of the output gate circuits OG1 through OGn are kept at "H" immediately after the turning-on of the voltage source, so that current is prevented from following through the thermal heads TH1 through THm. The TTL circuit according to the present invention, however, can be used for many purposes other than the thermal head driver.

According to the present invention, the output of the TTL circuit can be securely kept at "H" immediately after the voltage supply is turned on.

We claim:

1. A transistor transistor logic (TTL) circuit operatively connected to receive an external TTL signal and having a voltage supply, comprising:
   an input circuit operatively connected to receive the external TTL signal, for producing an output signal;
   an output circuit operatively connected to said input circuit;
   means, operatively connected between said output circuit and said input circuit, for controlling said output circuit, said controlling means receiving the output signal from said input circuit and supplying a controlling signal to said output circuit; and
   means, included in said means for controlling said output circuit, for delaying the operation of said controlling means until the voltage supply rises to a predetermined level after turning on, whereby the output of said TTL circuit is maintained at a high level until the voltage supply rises to the predetermined level.

2. A TTL circuit as defined in claim 1, wherein said output circuit comprises first and second output transistors operatively connected in series between the voltage supply and ground.

3. A TTL circuit as defined in claim 1 or 2, wherein said means for controlling said output circuit comprises:
   a first resistor operatively connected to ground;
   a second resistor operatively connected to the voltage supply; and
   a phase-splitter transistor having an emitter operatively connected to said first resistor, having a collector operatively connected to said second resistor and having a base having a potential.

4. A TTL circuit as defined in claim 3, wherein said means for delaying the operation of said controlling means comprises level shift means operatively connected between the voltage supply and the base of said phase-splitter transistor, for controlling the potential of the base of said phase-splitter transistor.

5. A TTL circuit as defined in claim 4, wherein said level shift means comprises a plurality of diodes operatively connected in series.

* * * * *

UNITED STATES PATENT AND TRADEMARK OFFICE
CERTIFICATE OF CORRECTION

PATENT NO.   :   4,481,427
DATED        :   NOVEMBER 6, 1984
INVENTOR(S)  :   HIROKAZU SUZUKI ET AL.

It is certified that error appears in the above-identified patent and that said Letters Patent is hereby corrected as shown below:

FRONT PAGE, Col. 2, line 11,
        "Stanley D. Miller" should be
        --Larry N. Anagnos--;

[57] ABSTRACT, line 5,
        "on" (second occurrence) should be --an--.

Col. 2, line 32, after "detail" insert --with--.

Col. 4, line 7, "following" should be --flowing--.

Signed and Sealed this

Twenty-eighth Day of May 1985

[SEAL]

Attest:

DONALD J. QUIGG

*Attesting Officer*    *Acting Commissioner of Patents and Trademarks*